(12) United States Patent
Masson

(10) Patent No.: US 7,576,577 B2
(45) Date of Patent: Aug. 18, 2009

(54) DEVICE FOR STATIC PHASE ERROR COMPENSATION IN A PHASE-LOCK LOOP SYSTEM WITH A SYMMETRICAL STRUCTURE

(75) Inventor: Gilles Masson, Voreppe (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 11/719,258

(22) PCT Filed: Nov. 4, 2005

(86) PCT No.: PCT/FR2005/002756
§ 371 (c)(1),
(2), (4) Date: May 14, 2007

(87) PCT Pub. No.: WO2006/051196
PCT Pub. Date: May 18, 2006

(65) Prior Publication Data
US 2008/0116946 A1    May 22, 2008

(51) Int. Cl.
*H03L 7/06* (2006.01)
(52) U.S. Cl. ............................. 327/156; 327/157
(58) Field of Classification Search ............ 327/156, 327/157, 158, 159
See application file for complete search history.

(56) References Cited

U.S. PATENT DOCUMENTS

| 5,477,177 | A   |   | 12/1995 | Wong et al. |       |
|-----------|-----|---|---------|-------------|-------|
| 6,111,470 | A   | * | 8/2000  | Dufour ........................ | 331/17 |
| 6,720,799 | B2  | * | 4/2004  | Gupta ........................ | 327/92 |

FOREIGN PATENT DOCUMENTS

EP    0 718 978 A1    6/1996

OTHER PUBLICATIONS

PCT International Search Report for Application No. PCT/FR2005/002756.*
PCT Request.
"A 500MHz MP/DLL Clock Generator for a 5Gb/s Backplane Transceiver in 0.25 μm CMOS" by Wei, et al. in 2003 IEEE International solid-State Circuit Conference, Paper 26.

* cited by examiner

*Primary Examiner*—Kenneth B Wells
*Assistant Examiner*—Daniel Rojas
(74) *Attorney, Agent, or Firm*—Brinks Hofer Gilson & Lione

(57) ABSTRACT

In a symmetrical phase-lock loop (PLL) device, first (I1P1, I1P2) and second (I2P1, I2P2) pairs of switches are disposed between (i) first and second outputs of a symmetrical time/voltage conversion block and (ii) first and second inputs of a voltage processing block. In addition, third (I3P1, I3P2) and fourth (I4P1, I4P2) pairs of switches are disposed upstream of the first and second inputs of the phase comparator (PC). Control means control the opening/closing of the first to fourth pairs of switches, such that: (a) during a first phase (P1), a first clock signal (Clkref) is connected to the first input of the comparator, a second clock signal (Clkdly) is connected to the second input of the comparator, the first output of the conversion block is connected to the second input of the processing clock and the second output of the conversion block is connected to the first input of the processing block; and (b) during a second phase (P2), the first clock signal is connected to the second input of the comparator, the second clock signal is connected to the first input of the comparator, the first output of the conversion block is connected to the first input of the processing block and the second output of the conversion block is connected to the second input of the processing block, in order to compensate the static phase error.

6 Claims, 6 Drawing Sheets

DEVICE FOR STATIC PHASE ERROR COMPENSATION IN A PHASE-LOCK LOOP SYSTEM WITH A SYMMETRICAL STRUCTURE

PRIORITY CLAIM

This application is U.S. nationalization of PCT Application No. PCT/FR2005/002756, filed Nov. 4, 2005, and claims priority to French patent application No. 0412084, filed Nov. 15, 2004.

TECHNICAL FIELD

The present invention relates to the compensation of the static phase error in a phase-lock loop system with a symmetric structure.

BACKGROUND

It finds one application in electronic circuits that have to produce clocks phase-shifted with great accuracy from a reference clock of very high frequency, typically greater than 1 GHz.

Thus it finds one application in phase-locked loop (PLL) systems or delay-locked loop (DLL) systems, in which it is necessary to convert a time offset into a proportional voltage with great accuracy.

The architecture of a prior art phase-locked loop system has been described with reference to FIG. 1. Such a phase-locked loop system generally includes:

a phase comparator, PC;

a time-voltage converter, TVC, equipped with a charge pump, CP, and a low-pass filter, PB; and a voltage-controlled delay line, CVDL.

The clock signals Clkout of the voltage-controlled delay line CVDL are clock signals of the same frequency as the clock signal Clkref but mutually phase-shifted by a duration that has to be controlled with great accuracy.

The phase comparator PC compares the reference clock signal Clkref and the last clock signal Clkdly from the delay line. The two clock signals Clkref and Clkdly must be in phase when the loop is locked.

In practice, the phase comparator PC delivers two logic signals Up and Dwn that are the image of the phase shift between the two clock signals Clkref and Clkdly to be perfectly synchronized. When the two clocks are not yet synchronized, the logic signals Up and Dwn have different durations.

It is this difference of duration that is to be converted into a proportional voltage, which is then integrated over time, in order to correct the error by means of a feedback loop.

Accordingly, the difference of duration between the signals Up and Dwn is converted into an integrated proportional voltage Vup-Vdwn that controls the delay line CVDL.

The static phase error in the phase-locked loop system from FIG. 1 has been described with reference to FIG. 2.

The static phase error ΔTspe is measured in locked mode and corresponds to a constant offset between the input clock signals of the phase comparator PC. It is the sum of all the mismatch errors present in the phase comparator PC and the time-voltage conversion block TVC.

The static phase error acts directly on the offset of the phase-shifted clock signals and constitutes the principal source of error in a phase-locked loop system.

Prior art phase-locked loop systems include particular architectures called "symmetrical structure" architectures, that is to say architectures based on symmetry in time-voltage conversion for the Up and Dwn channels for all operations carried out at high frequency.

Such architectures are known to reduce the static phase error structurally.

For example, one known symmetrical architecture is based on a differential charge pump, like that described in the document "A 500 MHz MP/DLL Clock Generator for 5 Gb/s Backplane Transceiver in 0.25 μm CMOS", ISCC 2003.

Another symmetrical time-voltage conversion structure is described in the patent application filed this day by the Applicant and entitled "Symmetrical time-voltage conversion circuit". In case it is of any benefit, the description of that application forms an integral part of the present invention.

The symmetrical architecture based on such a differential charge pump CP has been described with reference to FIGS. 3 and 4. In practice, the charge pump CP includes four control switches S1 to S4, S1 and S2 having for control input the signals Up and Dwn, respectively, and S3 and S4 having for control input the complements Upb and Ddwnb of the signals Up and Dwn, respectively.

The circuit further includes eight current flow transistors S5 to S12. The flow transistors S5 and S6 are means that regulate the flow of a current as a function of the bias voltage Vb1. The flow transistors S7 and S8 are controlled by a bias voltage Vb2. The flow transistors S9 and S10 are controlled by a bias voltage Vb3. The flow transistors S11 and S12 are controlled by a bias voltage Vb4.

Transistors S13 and S14 are controlled by a common mode feedback block CMFB. The block CMFB controls the common output mode, that is to say the mean level of the voltages Vdiff+ and Vdiff−.

When the signals Up and Dwn are opposed, the currents Iup and Idwn flow in the loop filter FB and are integrated to produce a differential voltage (Vdiff+−Vdiff−). That differential voltage is converted into a unipolar signal Vint by a converter CDU to control a delay line CVDL.

The structure of this differential architecture is called symmetrical in that the currents Iup and Idwn are generated by means of transistors of identical type and size. Similarly, the transistors S5 to S12 for the signals Up and Dwn are identical.

Three blocks have been added to compensate the static phase error.

An additional phase comparator CPA is used to detect the static phase error by comparing the clocks Clkref and Clkdly.

The Up and Dwn indications from the phase detector CPA are integrated in a digital counter CN.

A digital-analog converter CNA with current output is used to adjust the currents Iup and Idwn and to compensate the mismatch.

The compensation technique proposed in this differential charge pump architecture reduces the static phase error of the principal blocks but adds a source of error because of the mismatches present in the additional phase comparator CPA.

SUMMARY

The present invention solves these problems.

It relates to a phase-locked loop device including a phase comparator having first and second inputs respectively receiving first and second clock signals and first and second outputs respectively delivering first and second logic signals, a symmetrical time-voltage conversion block having at least first and second inputs respectively receiving the first and second logic signals and first and second outputs respectively delivering a voltage as a function of the first and/or second logic signals and a voltage processing block having first and second inputs respectively receiving first and second voltages to be processed.

According to a general definition of the invention, the device further includes first and second pairs of switches opened/closed alternately in accordance with first and second phases, interleaved between the first and second outputs of the symmetrical time-voltage conversion block, on the one hand, and the first and second inputs of the voltage processing block, on the other hand, third and fourth pairs of switches opened/closed alternately in accordance with the first and second phases, disposed on the upstream side of the first and second inputs of the phase comparator, and control means for controlling opening/closing of the first to fourth pairs of switches in such a manner as to connect during the first phase the first clock signal to the first input of the comparator and the second clock signal to the second input of the comparator and the first output of the conversion block to the second input of the processing block and the second output of the conversion block to the first input of the processing block and during the second phase the first clock signal to the second input of the comparator and the second clock signal to the first input of the comparator and the first output of the conversion block to the first input of the processing block and the second output of the conversion block to the second input of the processing block.

Such a structure compensates the static phase error present in the phase comparator and symmetrical time-voltage conversion block, continuously at low frequency and without adding components liable to introduce other errors.

In one embodiment, the time-voltage conversion block includes two structurally identical basic time-voltage converters each having an input receiving a respective logic control signal and an output delivering a voltage representative of the duration of the corresponding logic control signal.

In another embodiment, the voltage processing block includes a differentiator block having positive and negative inputs each connected to an output of an associated basic converter via the first and second pairs of switches and an output delivering a signal representative of the voltage difference between the two control signals.

In practice, the output of the voltage processing block forming a differentiator is connected to an integrator block.

For example, the differentiator block is a subtractor amplifier.

In another embodiment, the device further includes fifth and sixth pairs of switches opened/closed alternately in accordance with the first and second phases, disposed on the upstream side of the positive and negative inputs of the subtractor amplifier and control means for controlling opening/closing of said fifth and sixth pairs of switches in such a manner as to connect during the first phase the first output of the conversion block to the negative input and the second output of the conversion block to the positive input and vice-versa during the second phase.

For example, the integrator block is an active amplifier of RC type.

In a further embodiment, the device further includes seventh and eighth pairs of switches opened/closed alternately in accordance with the first and second phases, disposed on the upstream side of the positive and negative inputs of the active amplifier and control means for controlling opening/closing of said seventh and eighth pairs of switches in such a manner as to connect during the first phase the output of the differentiator block to the negative input of the active amplifier and a reference voltage to the positive input of the active amplifier and vice-versa during the second phase.

In a further embodiment, the time-voltage conversion block includes a time-voltage converter of the differential charge pump type and the voltage processing block is equipped with a converter having first and second inputs respectively receiving first and second differential voltages to be processed and an output delivering a unipolar signal.

BRIEF DESCRIPTION OF THE DRAWING

Other features and advantages of the invention will become apparent in the light of the following detailed description and from the drawings in which.

DETAILED DESCRIPTION

Figure 5:
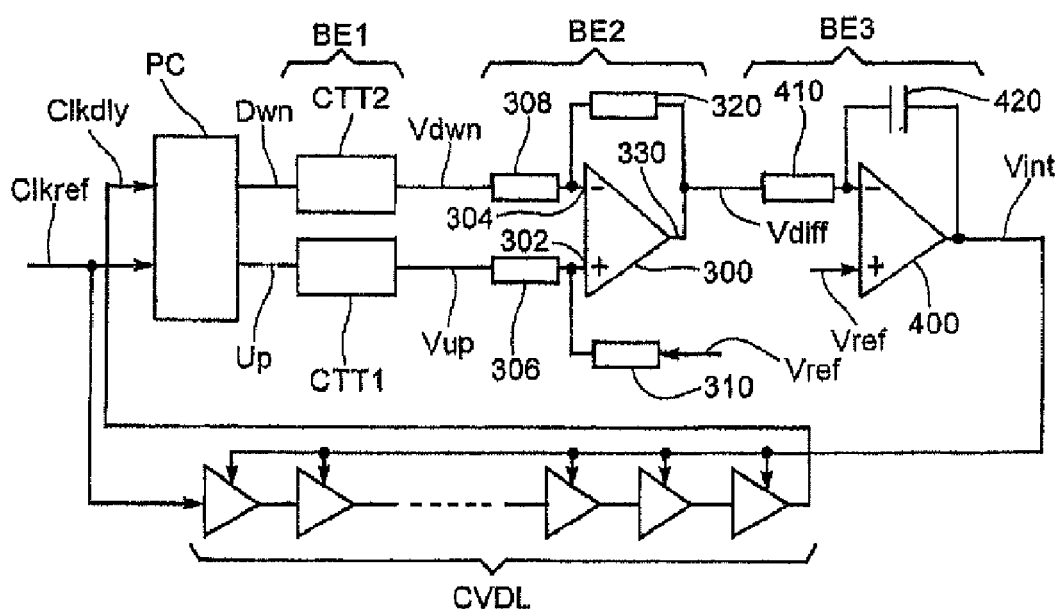
FIG. 5 represents diagrammatically a phase-locked loop system utilizing a symmetrical time-voltage converter with two basic channels.

Referring to FIG. 5, the phase-locked loop system includes five constituent blocks. The first block is the phase comparator PC, the second block BE1 relates to unipolar time-voltage conversion on two separate channels. The third block BE2 relates to the subtraction of the voltages of the unipolar channels. The fourth block BE3 relates to the integration of the difference of the two voltages and the fifth block CVDL is the delay line.

The conversion block BE1 includes signal switching operations that are effected in a perfectly symmetrical manner for the separate channels, which completely eliminates structural dynamic mismatching.

The conversion block BE1 includes two identical, separate and symmetrical basic time-voltage converters CTT1 and CTT2 in parallel. Each basic converter CTT1 or CTT2 has an input receiving a respective polarity control signal Up or Dwn and an output delivering a voltage Vup or Vdwn representative of the duration of each control signal.

A detailed description of each basic time-voltage converter is described in the application filed this day by the Applicant and entitled "Symmetrical time-voltage conversion circuit".

In case it is of any benefit, the description of that application forms an integral part of the present invention.

Time-voltage conversion is symmetrical. The voltage difference Vup–Vdwn is produced continuously by the block BE2. That block BE2 includes a subtractor amplifier 300 having a positive input 302 receiving the voltage Vup via a resistor 306 and a negative input 304 receiving the voltage Vdwn via a resistor 308. A reference voltage Vref feeds the positive input 302 via a resistor 310 and the output 330 is connected to the negative input 304 via a resistor 320.

The difference Vdiff is integrated continuously by an integrator BE3 including an active circuit amplifier 400 of resistor 410 and capacitor 420 type.

Figure 6:
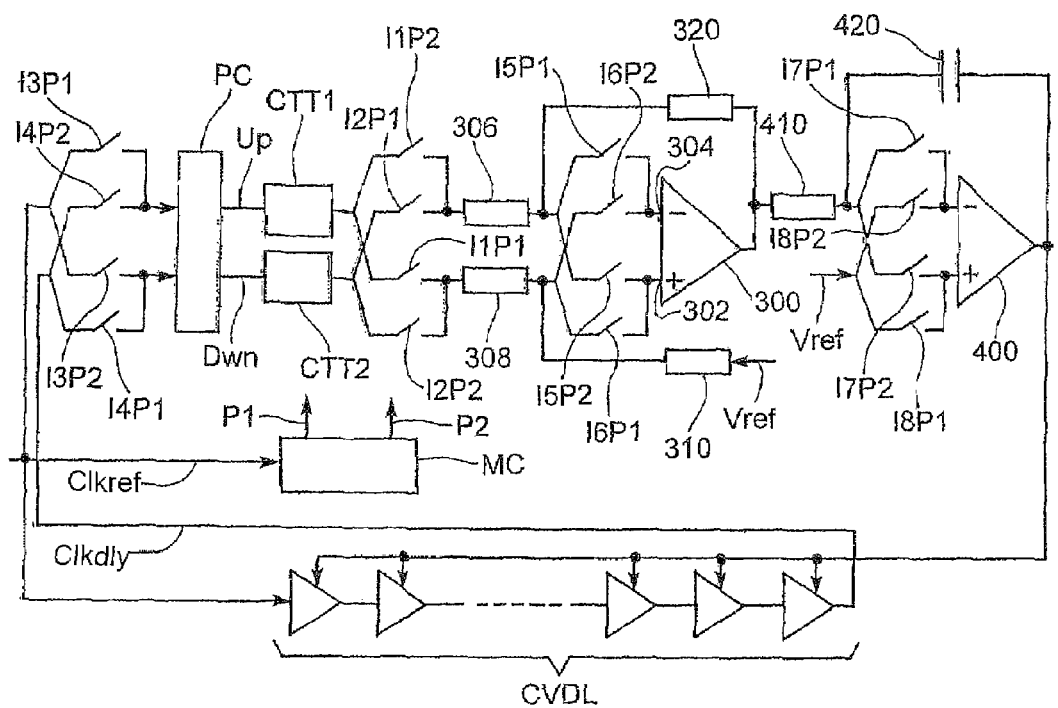
FIG. 6 represents diagrammatically a phase-locked loop system from FIG. 5 equipped with the static error compensation device according to the invention.

Referring to FIG. 6, there is provision for inverting the channels Clkref/Up and Clkdly/Dwn and for averaging the result of the time-voltage conversion with the integrator 400 of the phase-locked loop system.

To ensure correct operation of the loop, it is also necessary to invert the polarity of the control signal of the controlled delay line on each inversion of the channels Clkref/Up and Clkdly/Dwn.

The change from one channel to the other is effected by switches.

In practice, the device includes a first pair of switches I1P1 and I1P2 and a second pair of switches I2P1 and I2P2 opened/closed alternately in accordance with first and second phases P1 and P2, interleaved between the first and second outputs of the symmetrical time-voltage conversion block, on the one hand, and the first and second inputs of the voltage processing block, on the other hand.

Switches are further provided on the upstream side of the phase comparator PC. In this embodiment, the device includes a third pair of switches I3P1 and I3P2 and a fourth pair of switches I4P1 and I4P2 opened/closed alternately in accordance with the first and second phases P1 and P2, disposed on the upstream side of the first and second inputs of the phase comparator PC.

The control means MC control opening/closing of the first to fourth pairs of switches so as to connect during the first phase P1 the first clock signal Clkref to the first input of the comparator and the second clock signal Clkdly to the second input of the comparator and the first output of the conversion block to the second input of the processing block and the second output of the conversion block to the first input of the processing block and during the second phase P2 the first clock signal Clkref to the second input of the comparator and the second clock signal Clkdly to the first input of the comparator and the first output of the conversion block to the first input of the processing block and the second output of the conversion block to the second input of the processing block.

It may be noted with reference to FIG. 6 that the phase P1 corresponds to the operation of the phase-locked loop system described with reference to FIG. 5.

The phase P2 corresponds to operation in which the channel Clkref/Up takes the place of the channel Clkdly/Dwn and vice-versa.

In the two phases P1 and P2, the difference Vup–Vdwn is always rigorously produced at the differentiator BE2 in such a manner as to retain the functionality of the phase-locked loop system.

Thus the error or mismatch between the two channels is found after a differentiator BE2 with an opposite sign from one phase to the other.

For example, if it is assumed that the mismatch between the two channels gives rise to an error Ve, we have:

in phase P1, the output of the differentiator is $(Vup+Ve)-Vdwn=(Vup-Vdwn)+Ve$; and in phase P2, the output of the differentiator is $Vup-(Vdwn+Ve)=(Vup-Vdwn)-Ve$.

After filtering by the integrator, the theoretical residual peak to peak error is $Vrescc=Ve*\pi*fint/fcomp$, where fint is the cut-off frequency of the integrator BE3 and fcomp is the frequency of the compensation loop.

For example, if the frequency of the integrator is fixed at 100 kHz and the compensation frequency is fixed at 10 MHz, we have $Vrescc=Ve/31$, or a reduction of the initial error Ve by a factor of 31.

The offset caused by the mismatch of the transistors constituting the differential input pair of the amplifiers (A1) 300 and (A2) 400 is advantageously compensated according to the same principle. The offset is applied alternatively positively or negatively to the outputs of the amplifiers, the result is averaged by the integrator 400.

Thus the device includes a fifth pair of switches I5P1 and I5P2 and a sixth pair of switches I6P1 and I6P2 opened/closed alternately in accordance with the first and second phases P1 and P2, disposed on the upstream side of the positive and negative inputs of the subtractor amplifier 300.

The control means MC control opening/closing of the switches in such a manner as to connect the first output of the conversion block to the negative input and the second output of the conversion block to the positive input during the first phase P1 and vice-versa during the second phase P2.

In another embodiment, the device further includes a seventh pair of switches I7P1, I7P2 and an eighth pair of switches I8P1, I8P2 opened/closed alternately in accordance with the first and second phases P1 and P2, disposed on the upstream side of the positive and negative inputs of the active amplifier 400.

The control means MC control opening/closing of the switches in such a manner as to connect the output of the differentiator block to the negative input of the active amplifier and a voltage reference Vref to the positive input of the active amplifier during the first phase P1 and vice-versa during the second phase P2.

Figure 7:
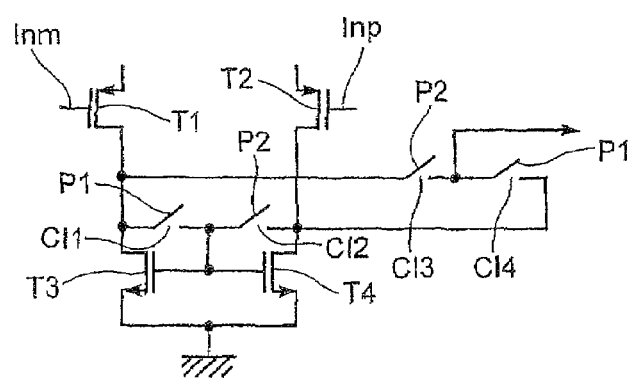
FIG. 7 lists in detail one embodiment of the compensation device according to the invention.

One embodiment of an amplifier A (300 or 400) including four transistors T1 to T4 and equipped with compensation means conforming to the invention has been described with reference to FIG. 7.

The compensation means include four internal switches CI1 to CI4. The switches CI1 and CI2 interchange the inputs Inp and Inm at a chosen frequency. Thus the input Inp becomes Inm and vice-versa. Switches CI3 and CI4 at the inputs of the amplifiers establish the connections with the external components of the amplifier, i.e. the resistors and capacitors (not shown).

To generate the control clocks of the switches during the phases P1 and P2 at the required compensation frequency, the input clock Clkref may be used, for example, divided down by a series of D flip-flops, individually denoted D1 to D7, and looped intoto a divider by 2.

The block must generate the low-frequency clocks P1 and P2 from the high-frequency reference clock Clkref. In particular, the reference clock Clkref of the system is divided by a coefficient that is a power of 2.

Figure 8:
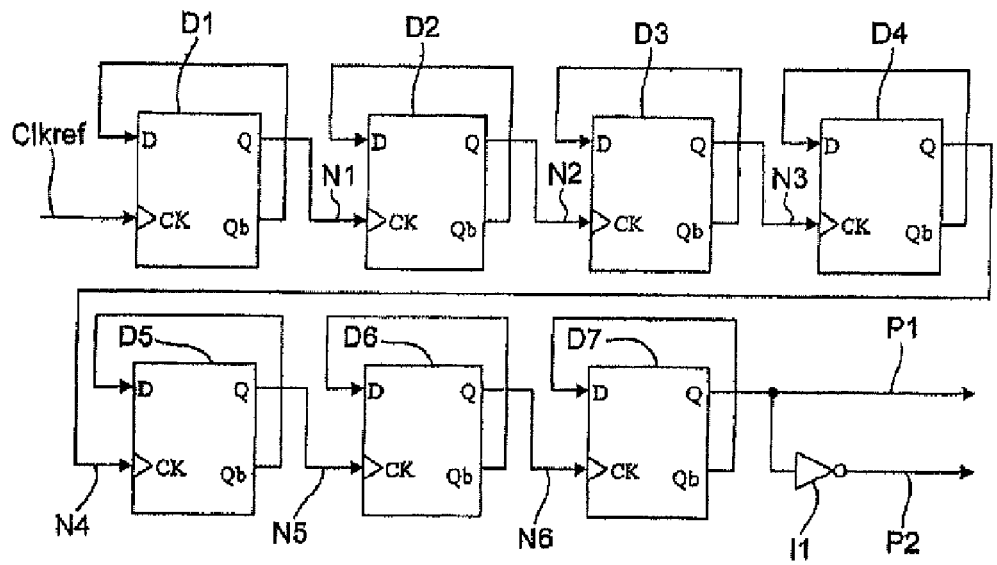
FIG. 8 shows diagrammatically one embodiment and the static phase error compensation control means according to the invention.
Figure 9:
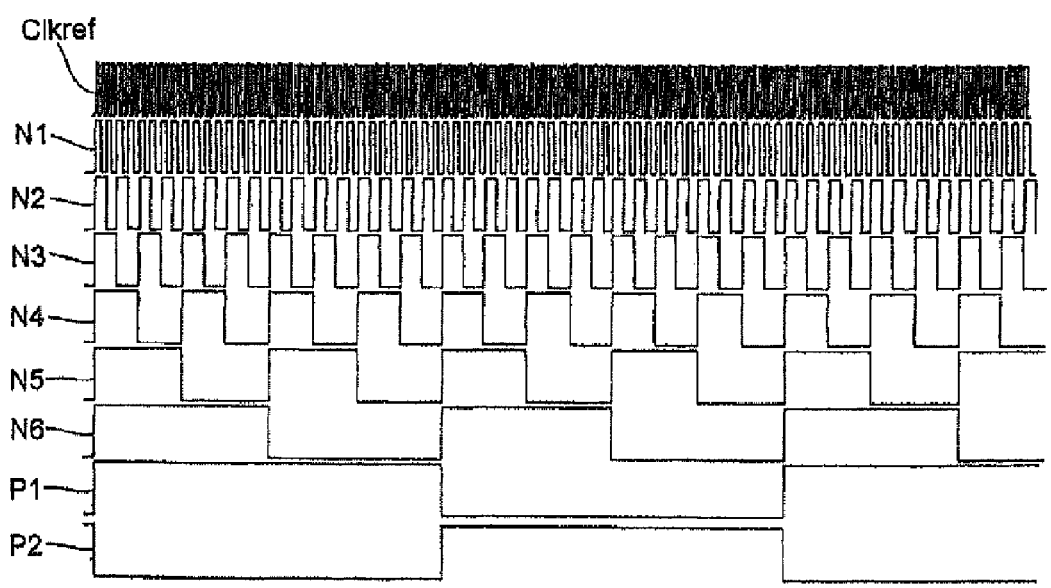
FIG. 9 shows timing diagrams of the control means from FIG. 10.

For example (FIGS. 8 and 9), if seven edge-triggered flip-flops (D1 to D7) are chained, looped into a divider by 2, the signal N1 is of frequency FClkref/2, the signal N2 is of frequency FClkref/4, the signal N3 is of frequency FClkref/8, the signal N4 is of frequency FClkref/16, the signal N5 is of frequency FClkref/32, the signal N6 is of frequency FClkref/64.

The phases P1 and P2 are therefore controlled by clocks of frequency FClkref/128.

The clock P2 generated by the inverter I1 is the complement of the clock P1.

The output Qb of the edge-triggered flip-flop is the complement of the output Q.

For example, with Fclkref equal to 1.25 GHz, a static phase error compensation frequency of 9.77 MHz is obtained.

Figure 10:
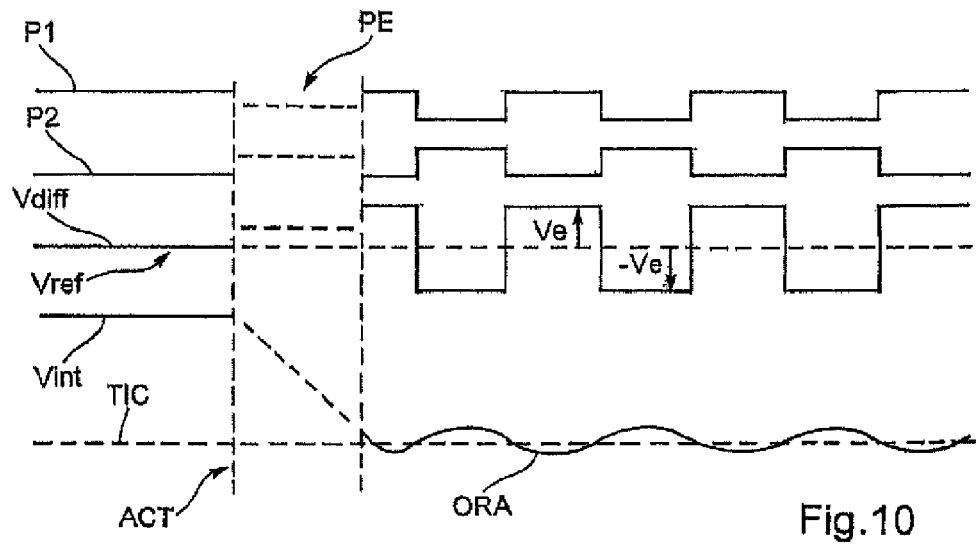
FIG. 10 shows timing diagrams relating to static phase error compensation according to the invention.

Timing diagrams illustrating the static phase error compensation have been described with reference to FIG. 10.

When static phase error compensation is not activated, it is seen that the voltage Vint is positioned so that the offsets between the clocks Clkref and Clkdly compensate the error Ve, i.e. so that the output Vdiff of the differentiator is exactly equal to the value Vref. In the example proposed, Vint is higher than the ideal control voltage (TIC) of the delay line, i.e. the value that gives the correct delay.

When compensation is activated (ACT) and in established mode (after the establishment period PE), the output of the differentiator Vdiff will be alternately subject to an error Ve and −Ve. If the compensation frequency is not too low compared to the bandwidth of the DLL loop, then the voltage Vdiff does not have time to return to the value Vref.

Thus "on average" the voltage Vint is at the ideal value for controlling the delay line. The residual ripple (ORA) obtained in compensation mode depends on the amplitude of the error (Ve), the compensation frequency (fcomp) and the bandwidth of the DLL (fint).

Figure 1:
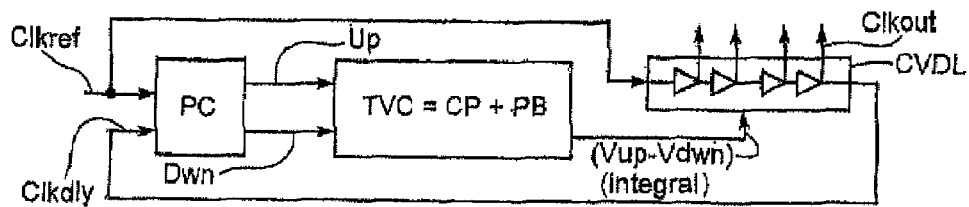
FIG. 1, shows a prior art phase-locked loop system.
Figure 2:
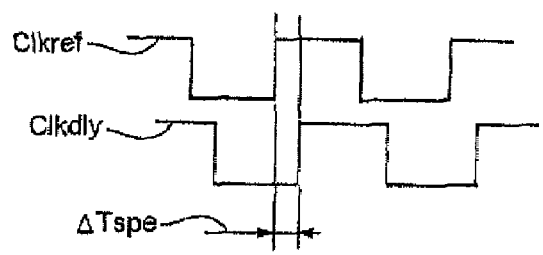
FIG. 2, represents timing diagrams of the clock signals of the FIG. 1 system.
Figure 3:
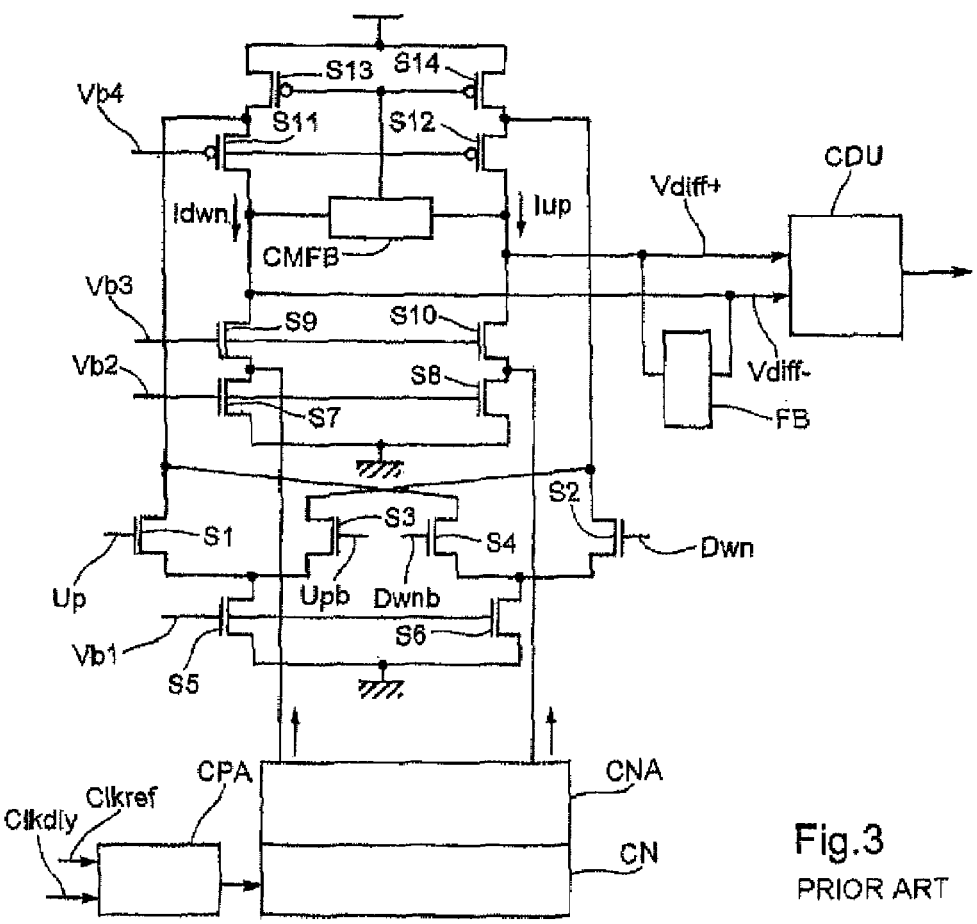
FIG. 3, shows diagrammatically a prior art differential type symmetrical time-voltage converter.
Figure 4:
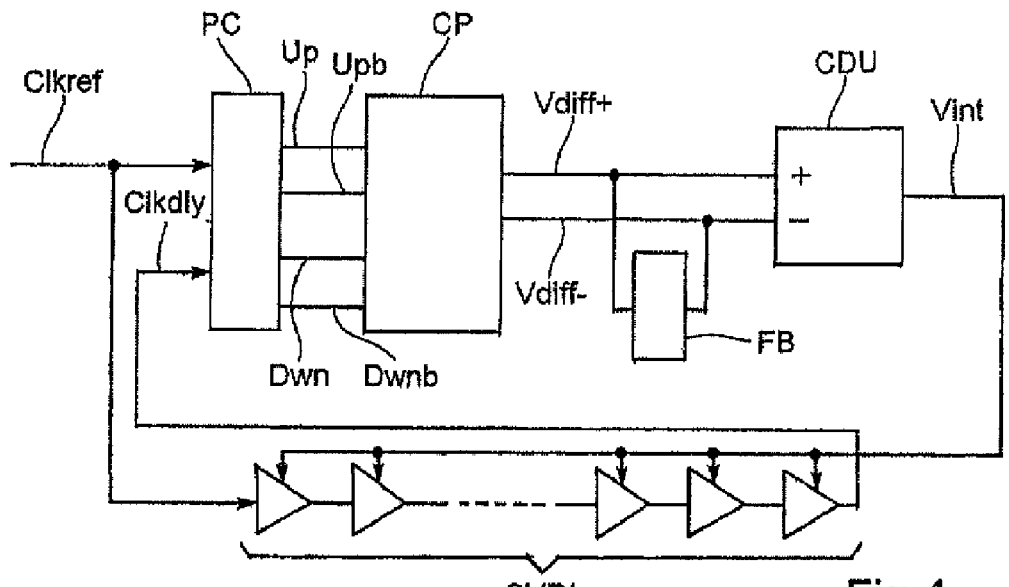
FIG. 4, shows diagrammatically a prior art phase-locked loop system utilizing a differential type symmetrical time-voltage converter from FIG. 3.
Figure 11:
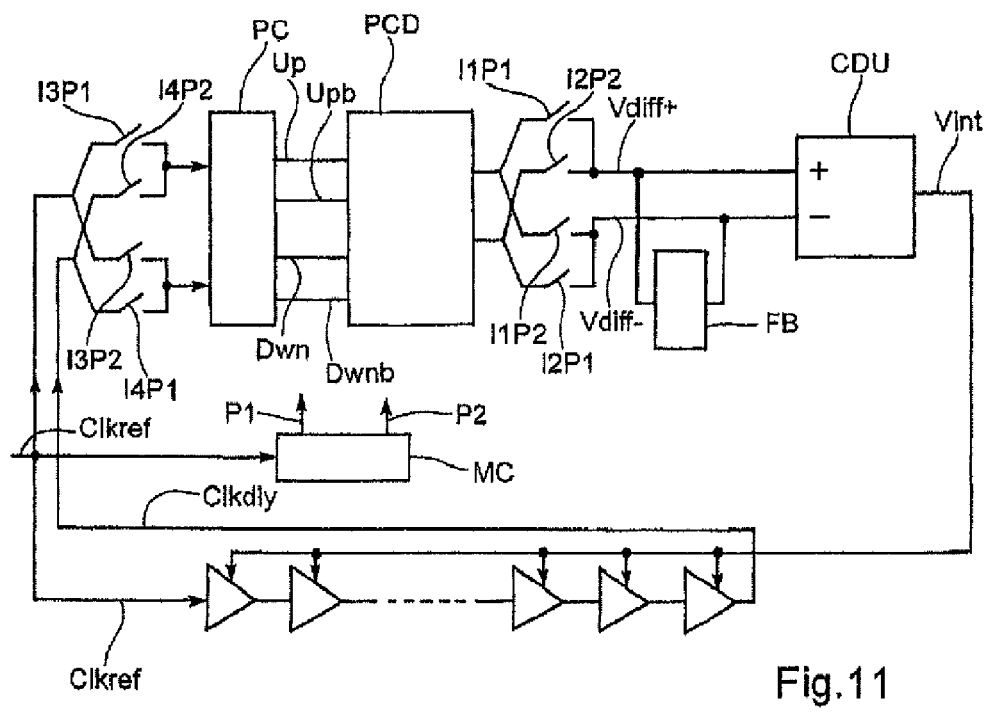
FIG. 11 represents diagrammatically a phase-locked loop system of the type described with reference to FIG. 4 and equipped with the static error compensation device according to the invention.

The phase-locked loop system from FIG. 4, equipped with the static error compensation device according to the invention has been represented with reference to FIG. 11.

The differential voltages Vdiff+ and Vdiff− resulting from the time-voltage conversion effected by the charge pump PCD and integrated by the loop filter FB are converted into a unipolar voltage Vint by the differential to unipolar conversion block CDU.

The operating principle of static phase error compensation is the same as that described previously with reference to FIGS. 5 to 10 for the architecture based on symmetrical time-voltage conversion.

The compensation loop compensates errors in the phase comparator PC and the differential charge pump PCD.

The change from one channel to the other is produced by switching the pairs of switches I1P1, I2P2, I1P2 and I2P1 and the pairs of switches I3P1, I4P2, I3P2 and I4P1 under the control of the control means MC. It may be noted that the phase P1 in the system described with reference to FIG. 11 corresponds to the operation of the phase-locked loop system according to the FIG. 4 diagram. The phase P2 corresponds to operation in which the channel Clkref/Up takes the place of the channel Clkdly/Dwn and vice-versa.

The signals of the channels Clkref/Up and Clkdly/Dwn are returned to the correct polarity ahead of the integrator loop filter FB to maintain the functionality of the phase-locked loop system.

The control logic MC generates signals for the phases P1 and P2.

The input clock Clkref divided down by a series of D flip-flops looped into a divider by 2 can be used to generate the control clocks of the switches during the phases P1 and P2 at the required compensation frequency.

Thus the present invention proposes static phase error compensation without adding components liable to introduce further errors. The only components added are switches consisting of transistors of small size and control logic.

The present invention compensates not only mismatching errors in time-voltage conversion but also mismatches in the phase comparator as the latter is also implemented symmetrically.

The compensation block according to the invention is simple to produce and necessitates no particular precautions in its implementation because the additional loop does not introduce any instability into the principal loop of the phase-locked loop system.

It is moreover possible to control the compensation level by modifying the cut-off frequency of the integrator and/or the activation frequency of the compensation loop.

Figure 12:
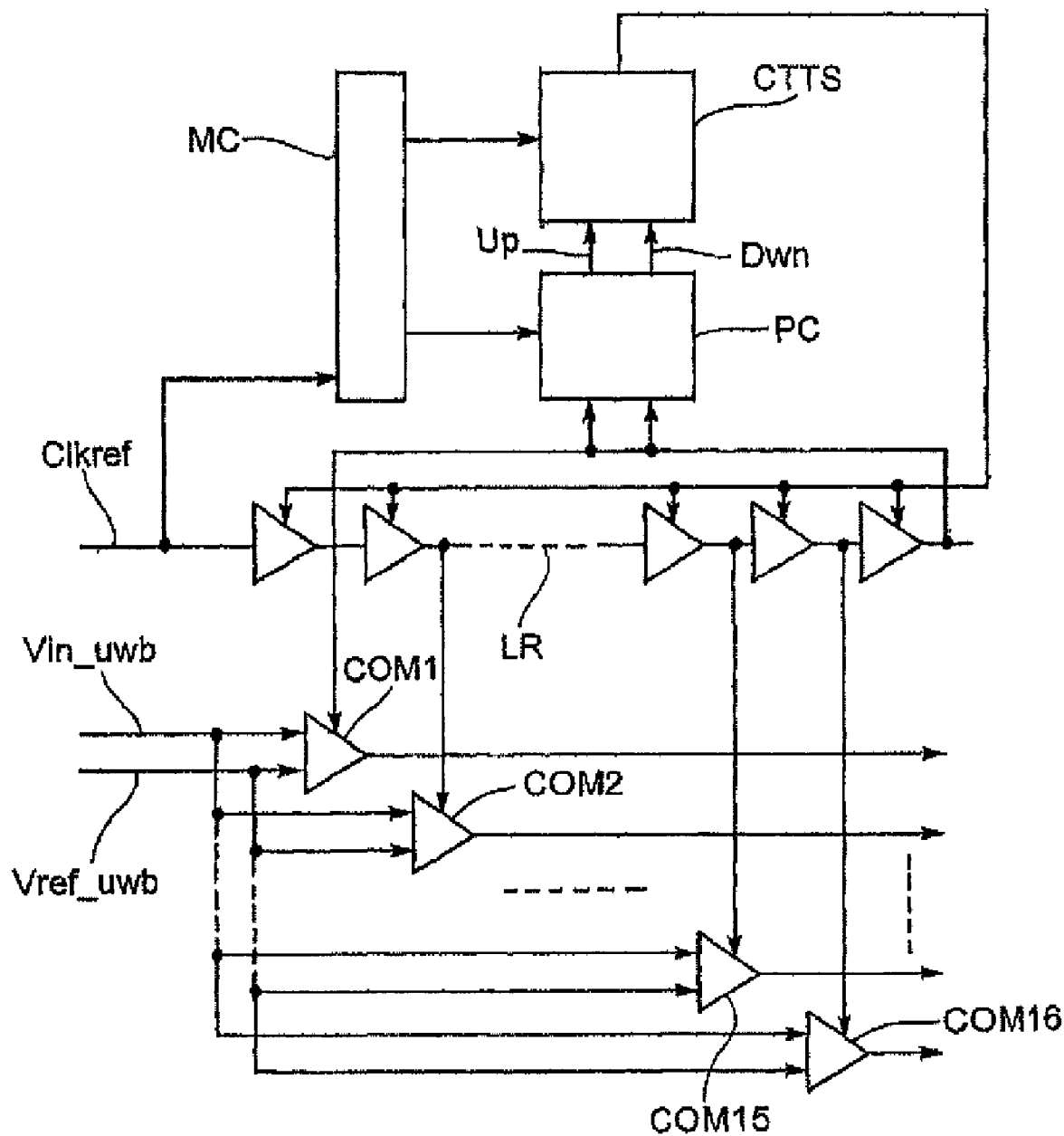
FIG. 12 is a block diagram of an analog-digital conversion architecture utilizing a phase-locked loop system according to the invention.

Referring to FIG. 12, the present invention finds one application in the conversion architecture of an ultra wide band (UWB) system in which a UWB signal at the frequency of 20 GHz is digitized on 1 bit.

For reasons of technological limitations, 1 bit conversion at 20 GHz is effected at lower frequency. For example 16 clocks are generated at the frequency of 1.25 GHz, offset by 50 ps. There is obtained in this way a 1-bit analog-digital converter operating at 20 GHz (50 ps) consisting of 16 comparators connected in parallel and controlled by 16 offset clocks.

An object of a phase-locked loop (DLL) is to control the delay or the offset of 50 ps and to generate the 16 clocks.

The analog signal to be converted is Vin_uwb. It is compared to a voltage Vref_uwb by means of 16 comparators COM individually denoted COM1 to COM16 connected in parallel. The comparators COM are activated at the frequency of 1.25 GHz with an offset of 50 ps. The results of the 16 conversions are sent to a logic block for reshaping and processing.

The 16 clocks offset by 50 ps are generated by the phase-locked loop system conforming to the invention and consisting of a voltage-controlled delay line LR, a phase comparator PC and a symmetrical time-voltage converter CTTS providing the best accuracy.

The compensation means articulated around switching means formed of pairs of switches and the associated control logic MC are integrated into the phase-locked loop system and improve the accuracy of the system at the operating frequency of 1.25 GHz.

The invention claimed is:

1. A phase-locked loop device including a phase comparator having first and second inputs respectively receiving first and second clock signals and first and second outputs respectively delivering first and second logic signals, a symmetrical time-voltage conversion block comprising two structurally identical basic time-voltage converters each having an input respectively receiving the first and second logic signals and each having an output respectively delivering a first voltage and a second voltage as a function of the duration of the first and/or second logic signals, and a voltage processing block comprising a differentiator block having first and second inputs respectively receiving first and second voltages, the device further comprising:

a first pair of switches and a second pair of switches opened/closed alternately in accordance with first and second phases, interleaved between the first and second outputs of the symmetrical time-voltage conversion block, and the first and second inputs of the voltage processing block, and a third pair of switches and a fourth pair of switches opened/closed alternately in accordance with the first and second phases, disposed on an upstream side of the first and second inputs of the phase comparator, wherein the differentiator block has a positive input and a negative input each connected to an output of an associated basic time-voltage converter via the first and second pairs of switches, and an output connected to an integrator block, the output delivering a signal representative of a voltage difference between the first and second logic signals, and control means for controlling opening/closing of the first to fourth pairs of switches in such a manner as to connect, during the first phase, the first clock signal to the first input of the comparator and the second clock signal to the second input of the comparator and the first output of the conversion block to the second input of the processing block and the second output of the conversion block to the first input of the processing block, and during the second phase, the first clock signal to the second input of the comparator and the second clock signal to the first input of the comparator and the first output of the conversion block to the first input of the processing block and the second output of the conversion block to the second input of the processing block.

2. The device according to claim 1 further comprising a voltage-controlled delay line having a first input receiving an output signal of the phase-locked loop device, a second input receiving the first clock signal and an output delivering the second clock signal.

3. A phase-locked loop device including a phase comparator having first and second inputs respectively receiving first and second clock signals and first and second outputs respectively delivering first and second logic signals, a symmetrical time-voltage conversion block comprising two structurally identical basic time-voltage converters each having an input respectively receiving the first and second logic signals and each having an output respectively delivering a first voltage and a second voltage as a function of the duration of the first and/or second logic signals, and a voltage processing block comprising a differentiator block having first and second inputs respectively receiving the first and second voltages, the device further comprising:

a first pair of switches and a second pair of switches opened/closed alternately in accordance with first and second phases, interleaved between the first and second outputs of the symmetrical time-voltage conversion block, and the first and second inputs of the voltage processing block, and a third pair of switches and a fourth pair of switches opened/closed alternately in accordance with the first and second phases, disposed on an upstream side of the first and second inputs of the phase comparator, wherein the differentiator block comprises a subtractor amplifier and has a positive input and a negative input each connected to an output of an associated basic time-voltage converter via the first and second pairs of switches, the output delivering a signal representative of a voltage difference between the first and second logic signals, control means for controlling opening/closing of the first to fourth pairs of switches in such a manner as to connect, during the first phase, the first clock signal to the first input of the comparator and the second clock signal to the second input of the comparator and the first output of the conversion block to the second input of the processing block and the second output of the conversion block to the first input of the processing block and, during the second phase, the first clock signal to the second input of the comparator and the second clock signal to the first input of the comparator and the first output of the conversion block to the first input of the processing block and the second output of the conversion block to the second input of the processing block, and a fifth pair of switches and a sixth pair of switches opened/closed alternately in accordance with the first and second phases, disposed on an upstream side of the positive and negative inputs of the subtractor amplifier, and control means for controlling opening/closing of said fifth and sixth pairs of switches in such a manner as to connect during the first phase the first output of the conversion block to the negative input and the second output of the conversion block to the positive input and vice-versa during the second phase.

4. The device according to claim 1 wherein the integrator block comprises an active amplifier of RC type.

5. The device according to claim 4 further comprising a seventh pair of switches and an eighth pair of switches opened/closed alternately in accordance with the first and second phases, disposed on the upstream side of the positive and negative inputs of the active amplifier and control means for controlling opening/closing of said seventh and eighth pairs of switches in such a manner as to connect during the first phase the output of the differentiator block to the negative input of the active amplifier and a reference voltage to the positive input of the active amplifier and vice-versa during the second phase.

6. The device according to claim 1, wherein the time-voltage conversion block further comprises a time-voltage converter of the differential charge pump type and the voltage processing block is equipped with a converter having first and second inputs respectively receiving first and second differential voltages to be processed and an output delivering a unipolar signal.

* * * * *